United States Patent [19]
Enderby

[11] 3,916,344

[45] Oct. 28, 1975

[54] DIRECT FM MODULATED HIGH FREQUENCY OSCILLATOR HAVING SELECTIVELY CONTROLLABLE FREQUENCY DEVIATION SENSITIVITY

[75] Inventor: Ralph T. Enderby, Coral Springs, Fla.

[73] Assignee: Motorola, Inc., Chicago, Ill.

[22] Filed: Sept. 16, 1974

[21] Appl. No.: 506,370

[52] U.S. Cl........... 331/116 R; 331/159; 331/177 V; 332/26; 332/30 V

[51] Int. Cl.²........................................... H03B 5/36

[58] Field of Search................ 331/116, 177 V, 159; 332/26, 30 V

[56] References Cited

UNITED STATES PATENTS

| | | | |
|---|---|---|---|
| 2,925,561 | 2/1960 | MacDonald | 332/26 |
| 3,061,802 | 10/1962 | Westneat, Jr. | 332/26 |
| 3,098,981 | 7/1963 | Foster et al. | 332/26 |
| 3,631,364 | 12/1971 | Lombard et al. | 332/26 |
| 3,747,023 | 7/1973 | Hoft et al. | 332/26 |

*Primary Examiner*—John Kominski
*Attorney, Agent, or Firm*—Donald B. Southard; James W. Gillman

[57] ABSTRACT

A high frequency, direct frequency modulated oscillator circuit suitable for use in two-way communications systems or the like. The oscillator includes first and second resonant frequency tuned circuits operative in a closed loop but separated from each other by isolation amplifiers or circuitry acting to produce the same effect. The first tuned circuit has a variable capacitance element (a varactor) to which the modulation signal is selectively applied, while the second resonant circuit has a series resonant crystal and a resistor for reducing the Q of the resonant crystal circuit. The modulation signal applied to the varactor changes the phase of the signal coupled through the first tuned circuit, which in turn changes the resonant frequency of the oscillator such that the phase of the signal coupled across the second tuned circuit compensates for the first phase change. The amount of oscillator frequency change depends on the Q of the first and second tuned circuits and can be adjusted for any desired sensitivity by changing the Q of the tuned circuits.

11 Claims, 4 Drawing Figures

DIRECT FM MODULATED HIGH FREQUENCY OSCILLATOR HAVING SELECTIVELY CONTROLLABLE FREQUENCY DEVIATION SENSITIVITY

BACKGROUND OF THE INVENTION

The present invention relates in general to direct frequency modulated (FM) oscillator circuits and in particular to an improved oscillator of the foregoing type which is capable of operating at relatively high frequencies and in which the amount of frequency deviation may be readily and effectively controlled.

Direct FM oscillators which use resonant crystals for obtaining nominal oscillator frequency stability are known in the art and are particularly used at relatively low frequencies, generally below 100 MHz. Such oscillators customarily employ a varactor and resonant crystal connected in series or parallel such that a change in the varactor reactance is compensated for by a corresponding shift in frequency, thereby causing the crystal to exhibit a compensating change in reactance. Since the crystal is normally a high Q resonant circuit, this means that a large change in varactor capacitance results in only a small change in resonant frequency. When utilized in two-way communication transmitters or the like, this represents a severe limitation on the level of deviation attainable. Additionally, it is known that varactors can exhibit only a finite maximum change of capacitance in response to a fixed level of modulation voltage applied to them. If an excessively large modulation signal is applied to the varactor, the capacitance change will become nonlinear and distortion will be encountered. As the resonant frequency of an oscillator increases, a much larger change in varactor capacitance is required to maintain the same frequency deviation, and soon a point is reached where presently available varactor diodes cannot exhibit a large enough linear change in capacitance to obtain a desired frequency deviation. In two-way communications, for example, a maximum deviation of 5 KC is permitted by FCC regulations, and a less noisy FM signal is obtained when the entire maximum deviation is used.

The prior method for obtaining a high frequency FM modulated maximum deviation signal is to modulate a low frequency carrier while maintaining maximum deviation and subsequently to frequency multiply the modulated low frequency carrier up to the desired high frequency. This frequency multiplication results in the necessity for more high frequency power gain and also results in the production of many unwanted harmonic frequencies which must later be filtered out.

SUMMARY OF THE INVENTION

An object of the invention is to provide an improved high frequency direct FM oscillator which overcomes the foregoing mentioned deficiencies.

Another object of the invention is to provide an improved crystal controlled direct FM oscillator capable of operating at relatively high frequencies and suitable for two-way communications applications, wherein the deviation sensitivity is selectively controllable within predetermined limits.

In an embodiment of the present invention a high frequency, direct FM oscillator operating in a closed loop configuration and having selectively controllable frequency deviation sensitivity is provided, comprising in combination: first and second impedance isolation means, each having an input and an output, for developing substantially impedance isolated signals between said input and said output first resonant circuit means coupling the output of said first isolation means to the input of said second isolation means and further including variable reactance means for changing reactance in response to modulation signal information applied thereto; second resonant circuit means coupling the output of said second isolation means to the input of said first isolation means and including a resonant crystal circuit; an de-Qing means for selectively lowering the Q of said resonant crystal circuit, said first and second circuit means and said first and second isolation means forming a closed loop oscillator operative at a predetermined frequency wherein said first resonant circuit provides a phase shift between said first and second isolation means in response to the applied modulation signal causing the oscillator frequency to shift such that said second resonant circuit will provide a compensating phase shift, the magnitude of the oscillator frequency shift being determined by said crystal de-Qing means.

An isolation amplifier having a low input impedance and a high output impedance is shown with a parallel resonant circuit connected as its load. The parallel tuned circuit includes a varactor in one of the parallel arms and the varactor capacitance is controlled by a modulation signal. The voltage developed across the parallel tuned circuit is connected to the input of a second isolation amplifier having a high input impedance and low output impedance and the output of the second amplifier is coupled through a series resonant crystal and a series connected resistor to the input of the first amplifier. The series resonant crystal and the series resistor form a series resonant circuit. When the varactor changes capacitance the signal across the first tuned circuit changes phase and, since the total phase shift in an oscillator loop must be zero, the resonant frequency of the oscillator shifts such that the resonant crystal circuit produces a compensating phase shift in the signal coupled from the output of the second amplifier to the input of the first amplifier. By making the oscillator frequency responsive to a change in phase instead of a change in reactance, it is possible to control the amount of deviation for any fixed level of modulation input signal since the phase change depends upon the Q of the first resonant circuit and the Q of the resonant crystal circuit. By increasing the resistor in series with the resonant crystal, the Q of the resonant crystal circuit is lowered and a large frequency deviation can be obtained even though only a small phase shift has occurred in the parallel tuned resonant circuit. Thus the amount of frequency deviation in response to a modulation input (deviation sensitivity) can be controlled, and the sensitivity is not solely dependent upon the amount of reactance change which the modulation signal causes.

BRIEF DESCRIPTION OF THE DRAWINGS

For a more complete understanding of the invention reference should be made to the drawings in which.

DETAILED DESCRIPTION OF THE PREFERRED EMBODIMENTS OF THE INVENTION

Figure 1:
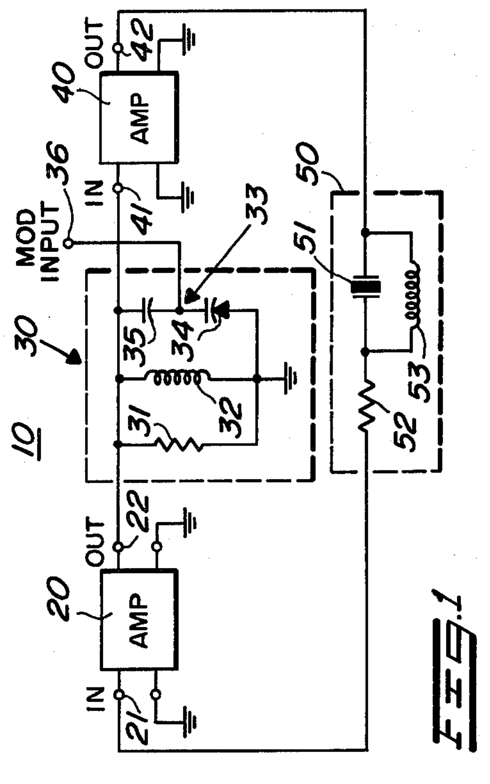
FIG. 1 is a circuit diagram of an FM oscillator constructed according to the present invention.

Referring now to the drawings, an oscillator circuit 10 is shown in FIG. 1 which includes an isolation amplifier 20, a parallel resonant tuned circuit 30 (shown dotted), an isolation amplifier 40, and a series resonant tuned circuit 59 (shown dotted). The isolation amplifier 20 has its input connected between an input terminal 21 and ground and has its output connected between an output terminal 22 and ground. The resonant tuned circuit 30 is a parallel tuned circuit connected between terminal 22 and ground, and consists of a resistor 31 in parallel with an inductor 32 in parallel with a capacitance generally referred to as 33. Capacitance 33 consists of a varactor 34 connected in series with a DC blocking capacitor 35, the anode of varactor 34 being connected to ground. The cathode of varactor 34 is connected to a modulation input terminal 36. Tuned circuit 30 essentially serves as the load of amplifier 20. Terminal 36 receives a DC bias signal for varactor 34 and also a modulation input signal which causes varactor 34 to change in capacitance value.

The isolation amplifier 40 has its input connected between an input terminal 41 and ground and has its output connected between an output terminal 42 and ground. Input terminal 41 is connected to output terminal 22, thus the input to amplifier 40 is a function of the voltage developed across parallel resonant circuit 30. Output terminal 42 is connected to input terminal 21 through series tuned circuit 50 consisting of a series resonant crystal 51 connected in series with a de-Qing resistor 52 and an inductor 53 being connected in parallel with crystal 51. Inductor 53 tunes out the parallel capacity of crystal 51 and the use of an inductor for tuning out parallel crystal capacity is well known in the art.

Crystal 51 is series resonant at the nominal resonant frequency of oscillator 10 and tuned circuit 30 is parallel resonant at the nominal resonant frequency when a zero modulation signal is applied to varactor 34. Amplifiers 20 and 40 are intended to exhibit substantially zero phase shift characteristics such that at the nominal resonant oscillator frequency tuned circuits 30 and 50 effectively contribute zero phase shift. Thus the total phase shift in the oscillator loop, formed by amplifiers 20 and 40 and tuned circuits 30 and 50, is zero at the nominal resonant frequency. The capacitance of varactor 34 changes when a modulation signal is present at terminal 36 and thus the voltage across parallel tuned circuit 30 undergoes a change in phase. In order to maintain zero phase shift in the oscillator loop, the resonant frequency shifts such that crystal 51 and resistor 52 now contribute a compensating phase shift, as can be more clearly understood by referring to FIG. 2.

Figure 2:
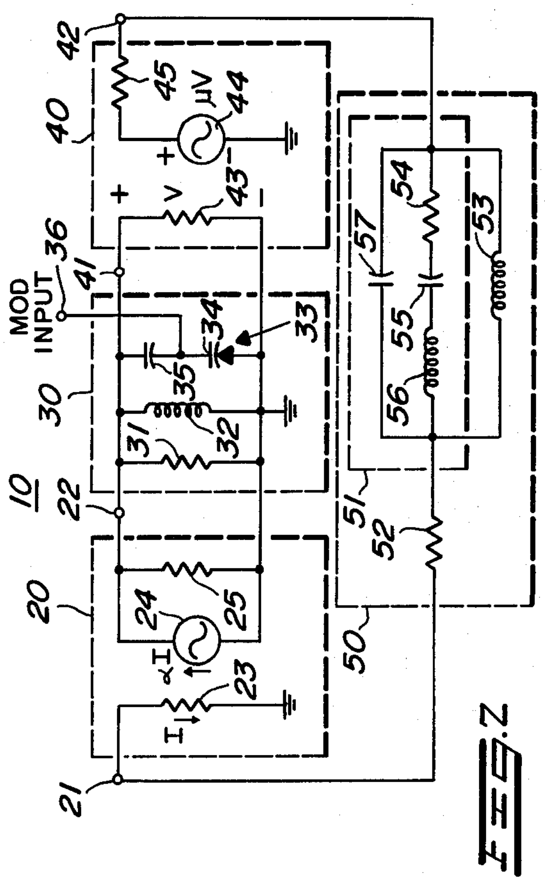
FIG. 2 is a circuit diagram of the equivalent circuit of FIG. 1.

Referring to FIG. 2, the same FM oscillator 10 shown in FIG. 1 is redrawn with amplifiers 20 and 40 and crystal 51 redrawn in their equivalent circuit forms (shown dotted) and all components in FIG. 2 are identically numbered and connected as described in FIG. 1. The equivalent circuit of amplifier 20 (shown dotted) consists of; an input impedance resistor 23 connected between input terminal 21 and ground and having a current I flowing through it, and a current generator 24 having a value of $\alpha I$ connected in parallel with an output impedance resistor 25 which is connected between output terminal 22 and ground. The equivalent circuit of amplifier 40 (shown dotted) consists of; an input impedance resistor 43 connected between terminal 41 and ground and developing a voltage (V) across it; and a voltage generator 44 having a value of $\mu V$ connected in series with an output impedance resistor 45, both being connected between output terminal 42 and ground. The equivalent circuit of series resonant crystal 51 consists of; a resistor 54, connected in series with a capacitor 55, connected in series with an inductor 56, all connected in parallel with inductor 53, and a parallel equivalent crystal capacitor 57 also connected in parallel with inductor 53.

With a zero input modulation signal initially present at terminal 36, the voltage across resistor 43 (V) is in phase with the current from generator 24 ($\alpha I$) because tuned circuit 30 is at resonance. When a modulation signal is present at terminal 36, the capacitance of varactor 34 will change and the phase of voltage V will shift with respect to the phase of current generator 24. The amount of phase shift can be shown to depend upon the percentage change of capacitance of varactor 34 and the Q of tuned circuit 30, assuming that the input impedance resistor 43 and the output impedance resistor 25 are sufficiently high in value with respect to resistor 31. If resistors 43 and 25 are not high in value with respect to resistor 31, a modified parallel resonant circuit Q can be defined including the effect of these resistors.

Amplification factors $\mu$ and $\alpha$ are considered to have zero phase shift in order to preserve the initial assumption that amplifiers 20 and 40 contribute zero phase shift to the oscillator loop. The phase shift caused by the change of varactor capacitance is compensated for by an oscillator frequency shift causing resonant crystal 51 and series resistor 52 to exhibit a compensating phase shift such that the total loop phase shift will still be equal to zero. Inductor 53 cancels the parallel capacitance of capacitor 57 at the nominal resonant frequency such that those elements will contribute no significant phase shift in response to small shifts in the resonant frequency. The phase shift between the voltage output of generator 44 and the current I through resistor 23 is then seen to be dependent upon the Q of a series resonant circuit represented by resistors 45, 52, 54, and 23, capacitor 55, and inductor 56. Assuming that resistor 23 represents a negligably small input impedance compared to resistor 52 and that resistor 45 represents a negligably small output impedance compared with resistor 52, it can be shown that the amount of phase shift between generator 44 and the current I through resistor 23 depends upon the percentage of the shift in frequency times twice the Q ($Q_x$) of the combination of series resistor 52 and series resonant crystal 51. If resistors 45 and 23 are not negligable in value compared to resistor 52, a modified $Q_x$ can be defined to include the effect of these resistors. $Q_x$ equals the inductive reactance of the series resonant crystal 51 at the nominal resonant frequency divided by the series resistance of resistors 52 and 54, which is equal to the Q of resonant tuned circuit 50. The Q of parallel tuned circuit 30 ($Q_t$) is defined as the reactance of resistor 31 divided by the inductive reactance of inductor 32 at the nominal resonant frequency.

In all the above calculations only a small shift in resonant frequency was considered and this small shift in frequency while being totally responsible for the phase shift contributed by the resonant crystal circuit 50, is not considered to effect the phase shift contributed by parallel tuned circuit 30; the phase shift of parallel tuned circuit 30 is assumed to be totally due to the change in capacitance of varactor 34. By equating the phase shift contributed by circuit 30 and the compensating phase shift contributed by circuit 50 the following equation can be derived:

$$\Delta f/f = (\Delta C/C)\ (Q_t/2Q_x) \qquad (1)$$

Where $\Delta f$ is the frequency shift, $f$ is the resonant frequency, $\Delta C$ is the change in varactor capacitance, and $C$ is the initial varactor capacitance. The resonant frequency shift ($\Delta f$) depends not only upon the shift in capacitance ($\Delta C$) but also upon the Q of parallel tuned circuit 30 and the Q of series resonant crystal circuit 50. The Q of a series resonant crystal alone is typically much higher than the Q of a resonant tank circuit constructed with discrete inductor, capacitor, and resistor elements. The Q of resonant circuit 51 ($Q_x$) however, can be adjusted so that any amount of frequency deviation (within some limits) can be obtained.

Only for small modulation voltages applied to varactor 34 is a linear change in varactor capacitance obtained, and a linear capacitance change is necessary to avoid distortion. Limiting the modulation voltage that can be applied to varactor 34 also limits the magnitude of the capacitance change available. The initial value of capacitance (C) of varactor 34 is determined by the nominal resonant frequency of oscillator 10 and for a high frequency oscillator this initial value of capacitance is very small. Varactors having an initial small capacitance and producing a large linear change in capacitance in response to a change in applied voltage are not available and thus prior art circuits could not obtain a directly modulated FM oscillator having a relatively large frequency deviation.

If a varactor were placed either in series or parallel with a resonant crystal, then any change in varactor capacitance would be compensated for by a very small change in resonant frequency because of the much higher effective values of inductive and capacitive reactance of the resonant crystal; thus a change in varactor reactance would be compensated for by a change in crystal reactance. By isolating the variable reactance element from the series resonant crystal through the use of isolation amplifiers, the reactance change is thus converted into a phase change, and from equation (1) it is apparent that by reducing the Q of the resonant crystal circuit ($Q_x$) it is possible to construct a varactor modulated crystal controlled oscillator which can exhibit any desired change in frequency in response to a fixed change in varactor capacitance. Since $Q_x$ is primarily controlled by the value of resistor 52 it is now possible to build an FM oscillator having a center frequency of 150 MHz and having a deviation of 5 KC with presently available resonant crystals and varactors. Isolation amplifiers 20 and 40 are required to prevent the reactance change of circuit 30 from being compensated for by merely an effective reactance change by crystal 51, and therefore the isolation amplifiers provide impedance isolation.

Figure 3:
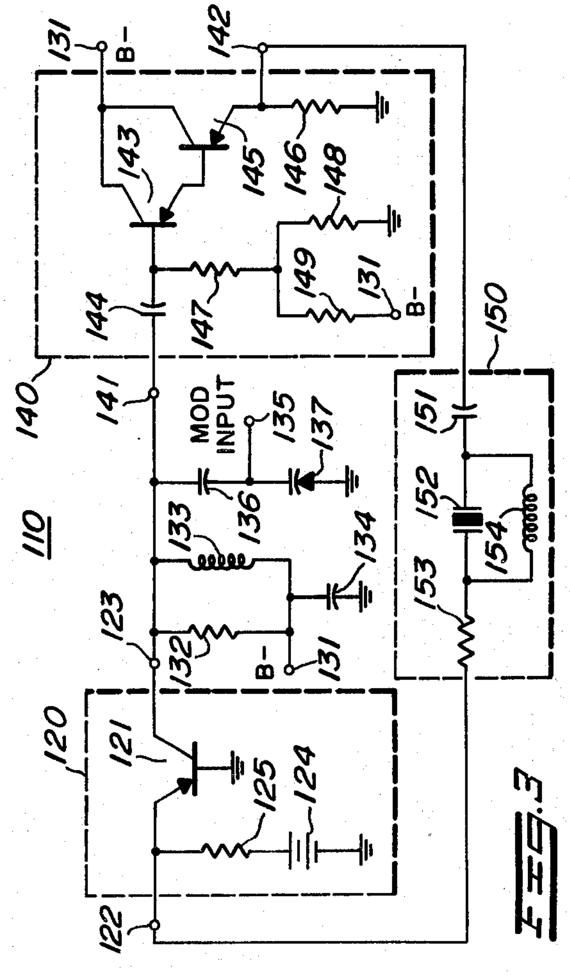
FIG. 3 is a schematic diagram of a particular embodiment of the present invention illustrating an oscillator having a common base stage and a common collector stage.

FIG. 3 shows an oscillator 110 as an embodiment of the general FM oscillator 10 shown in FIG. 1. An amplifier 120 (shown dotted) consists of: a PNP transistor 121 having its emitter terminal connected to an input terminal 122, its collector terminal connected to an output terminal 123, and its base connected to ground; the emitter of transistor 121 is connected to the positive terminal of a battery 124 through a resistor 125 and the negative terminal of battery 124 is connected to ground. Resistor 125 therefore supplies a bias potential to transistor 121 which is connected as a common base amplifier. Amplifier 120 is an embodiment of the general amplifier 20 shown in FIG. 1.

Terminal 123 is connected to a terminal 131 through a resistor 132 and an inductor 133 connected in parallel, and terminal 131 is adapted to receive a negative voltage. An RF bypass capacitor 134 is connected from terminal 131 to ground. Terminal 123 is also connected to a modulation input terminal 135 through capacitor 136, and a varactor 137 has its cathode connected to terminal 135 and its anode connected to ground. Terminal 135 receives a bias and modulation signal for varactor 137, and capacitor 136 prevents the varactor bias voltage from affecting other bias voltages.

An amplifier 140 (shown dotted) has an input terminal 141 and an output terminal 142 and contains all of the following recited components: A PNP transistor 143 having its base connected to terminal 141 through a DC blocking capacitor 144, its collector connected to terminal 131 and its emitter connected to the base of a PNP transistor 145 which has its collector connected to terminal 131 and its emitter directly connected to terminal 142 and connected to ground through a resistor 146. The base of transistor 143 being connected through a resistor 147 and a resistor 148 to ground and connected through resistor 147 and a resistor 149 to terminal 131.

Resistors 147, 148, and 149 supply the bias potential to the Darlington connected transistors 143 and 145 which are connected in a common collector amplifier configuration receiving a negative supply voltage from terminal 131. Terminal 141 is directly connected to terminal 123. Terminal 142 is connected to terminal 122 through a blocking capacitor 151, a series resonant crystal 152, and a Q reducing resistor 153 all connected in series. An inductor 154 is connected in parallel with series resonant crystal 152. Capacitor 151, crystal 152, resistor 153 and inductor 154 form a resonant crystal circuit 150 (shown dotted.)

Amplifier 120 is a common base amplifier stage which has a low input impedance and high output impedance and amplifier 140 is a common collector connected amplifier stage having a high input impedance and low output impedance. Amplifiers 120 and 140 in FIG. 3 are specific embodiments, respectively, of amplifiers 20 and 40 shown in FIG. 1. The operation of the oscillator circuit 110 shown in FIG. 3 is identical to the operation of oscillator 10 shown in FIG. 1 and will therefore not be described in detail. Capacitors 134, 136, 144 and 151 serve as DC blocking and RF bypass capacitors. The Q of the parallel tank circuit formed by resistor 132, inductor 133 and varactor 137 (corresponding to tank circuit 30 in FIG. 1 and 2) will not be substantially affected by the output impedance of amplifier 120 or the input impedance of amplifier 140 since both these impedances are relatively high, and the low output impedance of amplifier 140 and the low input impedance of amplifier 120 will not substantially affect the effective Q of the equivalent series resonant circuit. Thus the Q of the parallel tank circuit is primarily determined by resistor 132 and the Q of the series resonant crystal circuit is primarily determined by resistor 153, and for a given maximum available change in varactor capacitance the Q's of the resonant circuits can be adjusted such that any desired frequency deviation can be obtained.

Figure 4:
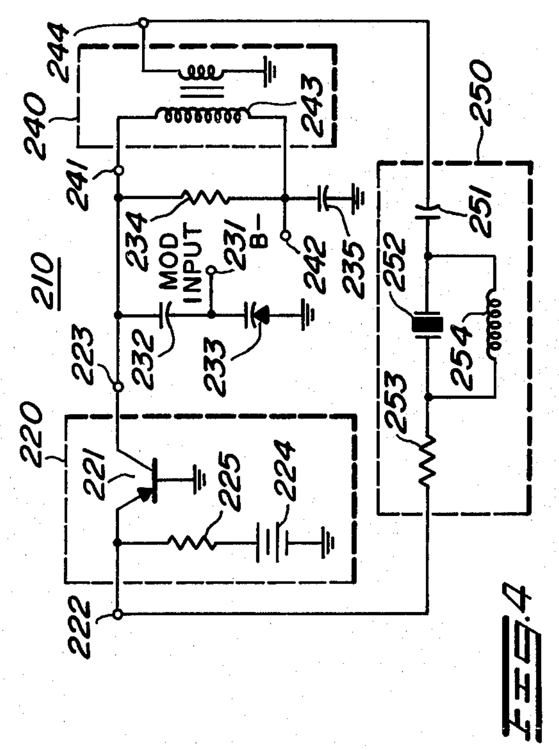
FIG. 4 is a schematic diagram of still another embodiment of the present invention illustrating an oscillator including a common base stage and a transformer stage.

FIG. 4 illustrates an oscillator 210 as an embodiment of the basic oscillator 10 shown in FIG. 1. An amplifier 220 (shown dotted) consists of: a PNP transistor 221 having its emitter connected to an input terminal 222, its collector connected to an output terminal 223 and its base connected to ground; the emitter of transistor 221 being connected to the positive terminal of a battery 224 through a resistor 225 and the negative terminal of battery 224 is connected to ground. Terminal 223 is connected to modulation input terminal 231 through a capacitor 232 which serves as a DC blocking and RF bypass capacitor. A varactor 233 has its cathode connected to terminal 231 and its anode connected to ground. An amplifier 240 (shown dotted) has: an input terminal 241 connected to a terminal 242, adapted to receive a negative bias voltage, through the primary winding of a transformer generally referred to as 243; and an output terminal 244 connected to ground through the secondary winding of transformer 243. Amplifier 240 includes only transformer 243. Terminal 241 is directly connected to terminal 223 and is connected to terminal 242 through a resistor 234. Terminal 242 is connected to ground through a bypass capacitor 235. A DC blocking capacitor 251 connected in series with a series resonant crystal 252 connected in series with a Q reducing resistor 253 and connects terminal 244 to terminal 222. An inductor 254 is connected in parallel with series resonant crystal 252. Components 251, 252, 523, and 254 form a resonant crystal circuit 250 (shown dotted.)

Amplifier 220 in FIG. 4 is identical to amplifier 120 in FIG. 3, also amplifier 240 in FIG. 4 has the high input impedance and low output impedance that amplifier 140 in FIG. 3 possesses. The operation of oscillator 210 in FIG. 4 is identical to the operation of the oscillator 110 in FIG. 3 and identical to the operation of oscillator 10 shown in FIG. 1 and therefore will not be discussed in detail. Resistor 234, the primary winding of transformer 243 and varactor 233 form a parallel tuned circuit which functions identically to parallel tuned circuit 30 in FIG. 1. Thus FIG. 4 discloses an FM oscillator which includes a common base stage amplifier and an isolation transformer.

Amplifiers 20 and 40 in FIG. 1, 120 and 140 in FIG. 3, and 220 and 240 in FIG. 4, all provide impedance isolation between a parallel resonant circuit, including a varactor controlled by a modulation input signal, and a series resonant crystal circuit. Isolation between the two resonant circuits is required so that independent Q values for the resonant circuits can be obtained and the assumptions made in deriving equation 1 can be realized. Thus a high frequency FM oscillator which has the inherent stability of a crystal controlled resonant circuit but is capable of being varactor modulated has been disclosed. The oscillator can control the magnitude of the resonant frequency deviation in response to a change of varactor capacitance by adjusting the Q values of two resonant circuits connected in a feedback loop and isolated from each other by isolation amplifiers.

While the specific oscillators shown in FIGS. 1 to 4 are responsive to the capacitance change of a varactor, the principle of controlling the Q of any two isolated resonant circuits to obtain a desired frequency deviation is not limited to the use of a varactor, any variable reactance source can be used. Also the varactor resonant circuit could be a series resonant circuit and/or the crystal resonant circuit could be a parallel resonant circuit and the basic concepts of the invention herein disclosed would still apply.

While I have shown and described specific embodiments of this invention, further modifications and improvements will occur to those skilled in the art. All such modifications which retain the basic underlying principles disclosed and claimed herein are within the scope of this invention.

I claim:

1. A high frequency, direct FM oscillator operating in a closed loop configuration and having selectively controllable frequency deviation sensitivity, comprising in combination:

First and second impedance isolation means, each having an input and an output, for developing impedance isolated signals between said input and said output, first resonant circuit means coupling the output of said first isolation means to the input of said second isolation means and further including variable reactance means for changing reactance in response to modulation signal information applied thereto;

second resonant circuit means coupling the output of said second isolation means to the input of said first isolation means and including a resonant crystal circuit; and de-Qing means for selectively lowering the Q of said resonant crystal circuit;

said first and second circuit means and said first and second isolation means forming a closed loop oscillator operative at a predetermined frequency wherein said first resonant circuit provides a phase shift between said first and second isolation means in response to the applied modulation signal causing the oscillator frequency to shift such that said second resonant circuit provides a compensating phase shift, the magnitude of the oscillator frequency shift being determined by said crystal de-Qing means.

2. The oscillator circuit of claim 1 wherein said variable reactance means includes a varactor diode.

3. The oscillator circuit of claim 2 wherein said crystal de-Qing means includes a resistor.

4. The oscillator circuit of claim 3 wherein said resistor is connected in series with said resonant crystal.

5. The oscillator circuit of claim 3 wherein said first resonant circuit means comprises a parallel resonant circuit coupled between the output of said first isolation means and RF ground, and the input said second isolation means is coupled between the output of said first isolation means and RF ground.

6. The oscillator circuit of claim 5 wherein said first isolation means has a low input impedance and a high output impedance and said second isolation means has a high input impedance and a low output impedance.

7. The oscillator circuit of claim 5 wherein an inductor is connected in parallel with said crystal for cancelling out the resonant crystal capacity.

8. The oscillator circuit of claim 1 wherein said first and second isolation means comprise first and second amplifier means.

9. The oscillator circuit of claim 8 wherein said first isolation means is a transistor amplifier in a common base configuration.

10. The oscillator circuit of claim 8 wherein said second isolation means is a transistor amplifier in a common collector configuration.

11. The oscillator circuit of claim 1 wherein said first isolation means is an isolation amplifier and said second isolation means comprises a transformer having a primary and a secondary winding.

* * * * *